US 9,172,378 B1

(12) United States Patent
Hutton et al.

(10) Patent No.: US 9,172,378 B1
(45) Date of Patent: Oct. 27, 2015

(54) PROGRAMMABLE LOGIC DEVICE HAVING LOGIC ELEMENTS WITH DEDICATED HARDWARE TO CONFIGURE LOOK UP TABLES AS REGISTERS

(71) Applicant: ALTERA CORPORATION, San Jose, CA (US)

(72) Inventors: Michael D. Hutton, San Jose, CA (US); Gregg William Baeckler, San Jose, CA (US); Jinyong Yuan, San Jose, CA (US); Chris Wysocki, Toronto (CA); Pouyan Djahani, Toronto (CA)

(73) Assignee: Altera Corporation, San Jose, CA (US)

( * ) Notice: Subject to any disclaimer, the term of this patent is extended or adjusted under 35 U.S.C. 154(b) by 41 days.

(21) Appl. No.: 14/068,386

(22) Filed: Oct. 31, 2013

Related U.S. Application Data

(63) Continuation of application No. 12/893,904, filed on Sep. 29, 2010, now Pat. No. 8,601,424, which is a continuation of application No. 11/499,451, filed on Aug. 4, 2006, now Pat. No. 7,890,910, which is a continuation of application No. 11/486,164, filed on Jul. 12, 2006, now Pat. No. 7,705,628.

(60) Provisional application No. 60/775,996, filed on Mar. 31, 2006.

(51) Int. Cl.
   *G06F 17/50* (2006.01)
   *H03K 19/173* (2006.01)
(52) U.S. Cl.
   CPC .................................. *H03K 19/173* (2013.01)

(58) Field of Classification Search
   CPC ........................................................ G06F 17/50
   USPC .......................................................... 716/116
   See application file for complete search history.

(56) References Cited

U.S. PATENT DOCUMENTS

| 5,757,207 A | 5/1998 | Lytle et al. |
| 5,977,792 A | 11/1999 | Mehendale |
| 6,130,552 A | 10/2000 | Jefferson et al. |

(Continued)

OTHER PUBLICATIONS

The Stratix II Architecture, Functional Description, pp. 2-1 through 2-104, from the Altera Corporation "Stratix II Device Handbook", vol. I, May 2005 or the Stratix Architecture, Version 3.3., Jul. 2005.

(Continued)

*Primary Examiner* — Thuan Do
(74) *Attorney, Agent, or Firm* — Weaver Austin Villeneuve & Sampson LLP

(57) ABSTRACT

A programmable logic device architecture having logic elements with dedicated hardware to configure the look up tables of the logic element to either perform logic functions or to operate as a register for pipelining. The programmable logic device includes a general interconnect and a plurality of logic array blocks interconnected by the general interconnect. Each of the plurality of logic blocks further includes one or more logic elements. The logic elements each include a first look up table, a second look up table, and dedicated hardware within the logic element to configure the first look table and the second look up table as a register without having to use the general interconnect. In one embodiment, the dedicated hardware includes a plurality of dedicated interconnects within the logic element to configure the two look up tables as a pair of cross coupled muxes or latches when configured as a register.

19 Claims, 13 Drawing Sheets

(56) References Cited

U.S. PATENT DOCUMENTS

| | | |
|---|---|---|
| 6,691,267 B1 | 2/2004 | Nguyen et al. |
| 7,019,557 B2 | 3/2006 | Madurawe |
| 7,100,141 B1 | 8/2006 | Ratchev et al. |
| 7,120,883 B1 | 10/2006 | van Antwerpen et al. |
| 7,205,790 B1 | 4/2007 | Young |
| 7,215,138 B1 | 5/2007 | Kondapalli et al. |
| 7,362,135 B1 * | 4/2008 | Chang .................. 326/47 |
| 7,477,072 B1 | 1/2009 | Kao et al. |
| 7,705,628 B1 | 4/2010 | Hutton et al. |
| 7,890,910 B1 | 2/2011 | Hutton et al. |
| 8,601,424 B1 | 12/2013 | Hutton et al. |
| 2007/0241782 A1 | 10/2007 | Teig et al. |

OTHER PUBLICATIONS

Hwang et al., U.S. Appl. No. 10/745,913 entitled "Technology Mapping Technique for Fracturable Logic Elements", filed Dec. 23, 2003.
Virtex Family Overview by Xilinx Corporation, Mar. 26, 2005.
Office Action dated Jun. 9, 2008 from U.S. Appl. No. 11/486,164.
Office Action dated Nov. 26, 2007 from U.S. Appl. No. 11/486,164.
Office Action dated Sep. 18, 2008 from U.S. Appl. No. 11/486,164.
Final Office Action dated Apr. 2, 2009 from U.S. Appl. No. 11/486,164.
Notice of Allowance dated Aug. 25, 2009 from U.S. Appl. No. 11/486,164.
Notice of Allowance dated Dec. 8, 2009 from U.S. Appl. No. 11/486,164.
Office Action dated Jun. 4, 2008 from U.S. Appl. No. 11/499,451.
Office Action dated Dec. 24, 2008 from U.S. Appl. No. 11/499,451.
Office Action dated May 21, 2009 from U.S. Appl. No. 11/499,451.
Restriction Requirement dated Dec. 7, 2009 from U.S. Appl. No. 11/499,451.
Notice of Allowance dated Apr. 8, 2010 from U.S. Appl. No. 11/499,451.
Notice of Allowance dated Sep. 30, 2010 from U.S. Appl. No. 11/499,451.
Office Action dated Apr. 18, 2013 from U.S. Appl. No. 12/893,904.
Notice of Allowance dated Jul. 31, 2013 from U.S. Appl. No. 12/893,904.

* cited by examiner

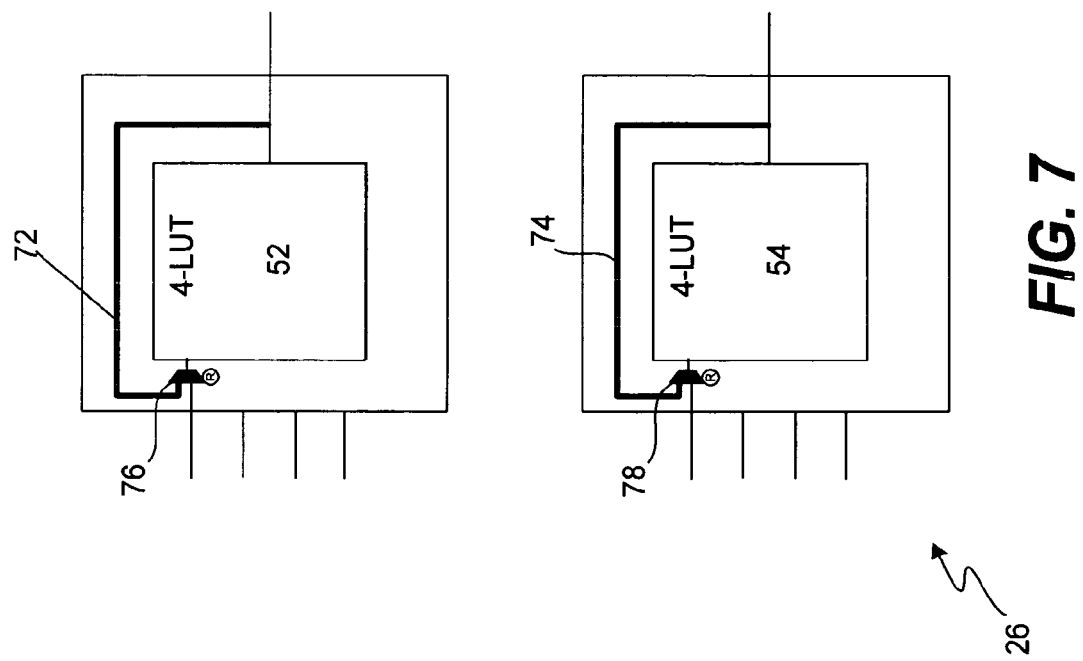

PROGRAMMABLE LOGIC DEVICE HAVING LOGIC ELEMENTS WITH DEDICATED HARDWARE TO CONFIGURE LOOK UP TABLES AS REGISTERS

CROSS-REFERENCE TO RELATED APPLICATIONS

This application is a continuation of co-pending U.S. patent application Ser. No. 12/893,904, filed Sep. 29, 2010, and titled "PROGRAMMABLE LOGIC DEVICE HAVING LOGIC ELEMENTS WITH DEDICATED HARDWARE TO CONFIGURE LOOK UP TABLES AS REGISTERS", which is hereby incorporated by reference in its entirety. U.S. patent application Ser. No. 12/893,904 is a continuation of U.S. patent application Ser. No. 11/499,451, filed Aug. 4, 2006, now U.S. Pat. No. 7,890,910, issued Feb. 15, 2011, and titled "PROGRAMMABLE LOGIC DEVICE HAVING LOGIC ELEMENTS WITH DEDICATED HARDWARE TO CONFIGURE LOOK UP TABLES AS REGISTERS", which is hereby incorporated by reference in its entirety. U.S. patent application Ser. No. 11/499,451 is a continuation of U.S. patent application Ser. No. 11/486,164, filed Jul. 12, 2006, now U.S. Pat. No. 7,705,628, issued Apr. 27, 2010, and titled "PROGRAMMABLE LOGIC DEVICE HAVING LOGIC ELEMENTS WITH DEDICATED HARDWARE TO CONFIGURE LOOK UP TABLES AS REGISTERS", which is hereby incorporated by reference in its entirety. U.S. patent application Ser. No. 11/486,164 claims the benefit of U.S. Provisional Patent Application No. 60/775,996, filed Mar. 31, 2006, and titled "PROGRAMMABLE LOGIC DEVICE HAVING LOGIC ELEMENTS WITH DEDICATED HARDWARE TO CONFIGURE LOOK UP TABLES AS REGISTERS", which is hereby incorporated by reference in its entirety.

BACKGROUND

1. Field of the Invention

The present invention generally relates to programmable logic devices, and more particularly, to a programmable logic device having logic elements with dedicated hardware to programmably configure Look Up Tables (LUTs) as registers.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

Most PLDs contain a two-dimensional row and column based architecture to implement custom logic. A series of row and column interconnects, typically of varying length and speed, provide signal and clock interconnects between blocks of logic on the PLD. The blocks of logic, often referred to by such names as Logic Elements (LEs), Adaptive Logic Modules (ALMs), or Complex Logic Blocks (CLBs), usually include one or more look up table (LUTs), registers for generating registered logic outputs, adders and other circuitry to implement various logic and arithmetic functions.

With many logic designs implemented on PLDs, it would be desirable to provide logic elements having additional registers for handling functions beyond just generating registered logic outputs. This is particularly true with the advances in semiconductor process technology. As device geometries shrink with each new generation of process technology, the propagation delays of logic devices (e.g., LUTs and registers) and signal propagation delays over interconnect are also reduced. However, the reduction in the propagation delays between logic devices and interconnect is not symmetrical. In general, interconnect propagation delays have not been reduced at the same rate as propagation delays through logic. As a consequence, designers have added more registers in the signal propagation paths of circuit designs for the purpose of pipelining the critical path of the circuit, which is defined as the longest possible delay between any two registers (i.e., typically an input and an output register). By adding extra registers, the clock rate used to clock the operations of the circuit can be increased. In other words, by adding more pipelined stages to the critical path, and increasing the clock speed, the net result is a faster throughput.

With existing PLD architectures, such as those mentioned above, the registers in a logic element can be used for pipelining. When the registers are used for this function though, the remaining logic of the logic element remains un-used. In other words, the other logic elements, such as the LUTs, can not be used for implementing logic. While it is possible for circuit designers to implement LUTs in a logic element as a register with existing PLDs, to do so is impractical. With current PLDs, no local interconnect or other hardware resources within the logic element is provided for implementing LUTs as a register. Instead, signals generated by one LUT in a logic element need to be routed through the general interconnect of the device and then back into a second LUT in the logic element to implement the register function. Since the signals are routed over the general interconnect, the operational speed of the LUTs when configured as a register is far too slow to be practically used in most design implementations, such as pipelining. Thus, when the registers of a logic element are used for pipelining, the LUT(s) of a logic element are essentially wasted. Accordingly, while circuit designers may currently use the registers in logic elements for pipelining to increase clock speeds and throughput, the tradeoff is often an inefficient use of the LUT resources on the device.

A PLD architecture having logic elements with dedicated hardware to configure the LUTs of a logic element to either perform logic functions or to operate as a register for pipelining or other purposes is therefore needed.

SUMMARY OF THE INVENTION

A programmable logic device architecture having logic elements with dedicated hardware to configure the look up tables of the logic element to either perform logic functions or to operate as a register for pipelining or other purposes is disclosed. The programmable logic device includes a general interconnect and a plurality of logic array blocks interconnected by the general interconnect. Each of the plurality of logic blocks further includes one or more logic elements. The logic elements each include a first look up table, a second look up table, and dedicated hardware within the logic element to configure the first look table and the second look up table as a register without having to use the general interconnect. In one embodiment, the dedicated hardware includes a plurality of dedicated interconnects within the logic element to configure the two look up tables as a pair of cross coupled muxes or latches when configured as a register.

BRIEF DESCRIPTION OF THE DRAWINGS

The invention may best be understood by reference to the following description taken in conjunction with the accompanying drawings, which illustrate specific embodiments of the present invention.

FIG. 7 illustrates a second dedicated hardware implementation to configure the LUTs of the logic element to operate as a register in the exemplary PLD of the present invention.

It should be noted that like reference numbers refer to like elements in the figures.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
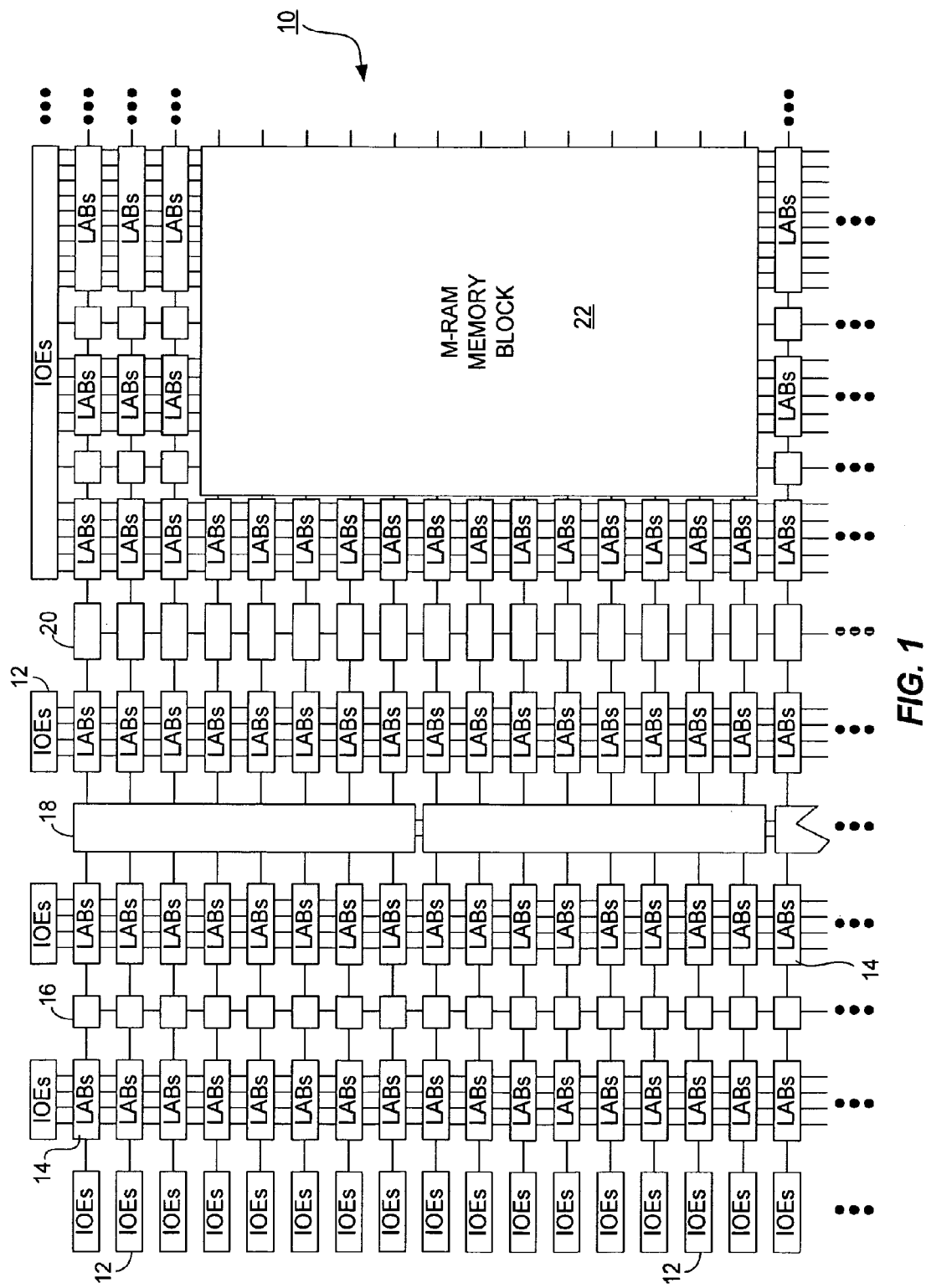
FIG. 1 a block diagram of an exemplary Programmable Logic Device (PLD) of the present invention is shown.

Referring to FIG. 1, a block diagram of an exemplary Programmable Logic Device (PLD) of the present invention is shown. The PLD 10 includes a two dimensional row and column based architecture including a plurality of Input/Output elements (IOEs) 12 arranged around the periphery of the chip, a plurality of Logic Array Blocks (LABs) 14 grouped into rows and columns across the device, Random Access Memory (RAM) blocks 16 grouped into columns between certain LABs 14, Digital Signal Processing (DSP) blocks 18 grouped into columns across the device, second RAM blocks 20 also grouped into columns across the device and between certain LABs 14, and one or more M-RAM memory blocks 22 each provided at different locations across the device.

In one embodiment, the LABs 14 include a number of logic elements (LEs) (not visible in the figure) which are the basic logic building blocks for implementing user defined logic functions. The RAM blocks 16 are simple dual port memory blocks with a predetermined number of bits and additional parity bits. The RAM blocks 16 provide dedicated simple dual port or single port memory for the device. The DSP blocks 18 are provided for performing digital signal processing functions, such as for example, finite impulse response (FIR) and infinite impulse response (IIR) filters. The second RAM blocks 20 are true dual port memory blocks with memory bits and parity bits. Finally, the M-RAM memory blocks 22 are large true dual port memory blocks with both memory and parity bits.

It should be noted that the PLD 10 is merely exemplary and in no way should be construed as limiting the invention. For more information on the specific PLD architecture 10 illustrated in FIG. 1, see for example the Stratix II Architecture, Functional Description, pages 2-1 through 2-104, from the Altera Corporation "Stratix II Device Handbook", Volume 1, May, 2005, or the Stratix Architecture, Version 3.3, July, 2005, both incorporated by reference herein for all purposes. The present invention, however, as described in detail below can be implemented in any type of programmable logic device that relies on or uses look up tables (LUTs), product term arrays or other programmable structures such as programmable multiplexers for implementing logic functions.

Figure 2:
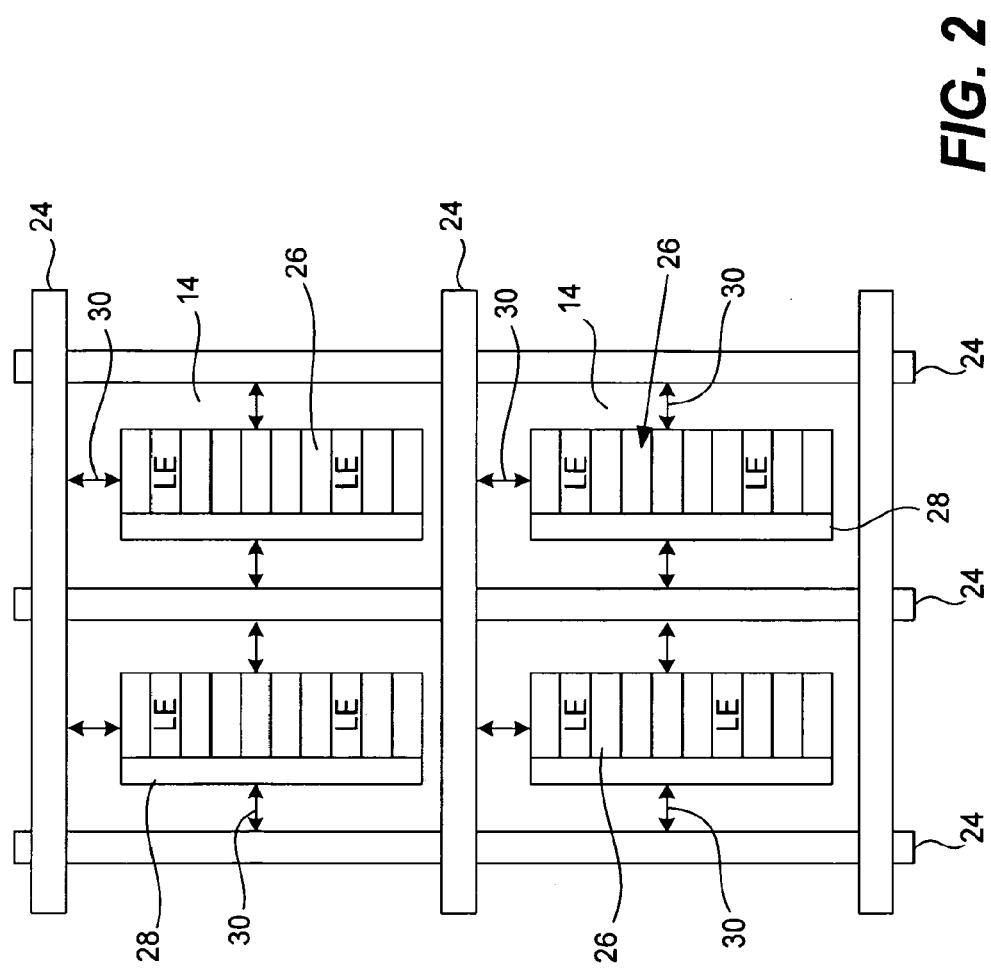
FIG. 2 is a block diagram of several logic array blocks (LABs) in the exemplary PLD of the present invention.

Referring to FIG. 2, a block diagram of several logic array blocks (LABs) in an exemplary PLD is shown. The figure shows four LABs 14 interconnected by a plurality of general horizontal (row) and vertical (column) interconnect lines 24. Each LAB 14 includes a plurality of logic elements (LEs) 26. In the embodiment shown, there are ten (10) LEs 26 per LAB 14. It should be noted that this number is arbitrary, and that any number of LEs 26 may be used per LAB 14. A LAB wide interconnect 28 is also provided to interconnect the LEs 26 within each LAB 14. Interconnects 30 are provided between the LEs 26 of each LAB 14 and the general horizontal and vertical interconnects 24.

Figure 3:
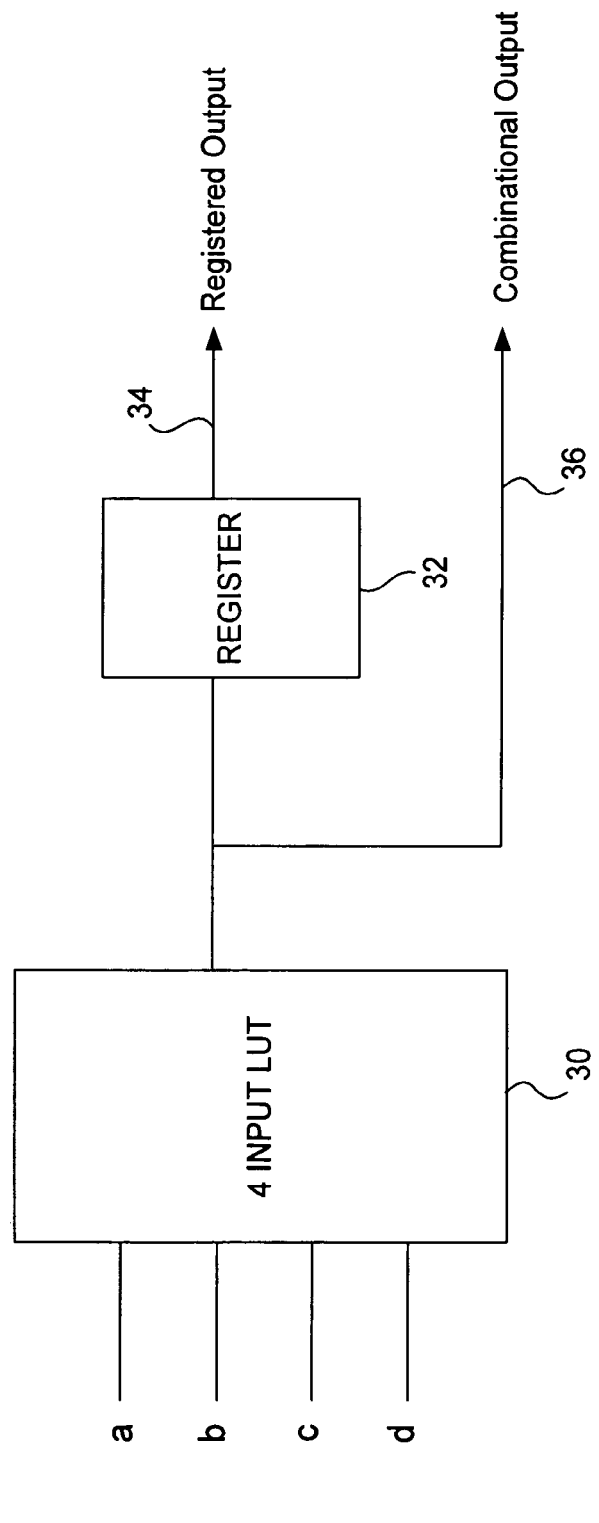
FIG. 3 is a logic block diagram of a Logic Element (LE) used in the LABs of the exemplary PLD of the present invention.

Referring to FIG. 3, a logic block diagram of a Logic Element (LE) 26 used in the LABs 14 of the present invention is shown. The LE 26 includes a four (4) input LUT 30 and a dedicated register 32. The LUT 30 is coupled to receive four select input signals (a, b, c, and d). The output of the LUT 30 is provided as either a registered output 34 through register 32 or as a combinational output signal 36. As is well known in the art, the LUT 30 is capable of generating one of a possible sixteen outputs, depending on the state of the four select inputs signals (a, b, c, and d). The output of the LUT 30 is thus defined as an arbitrary four input function of F=f(a, b, c, d). For the sake of simplicity, it should be noted that the dedicated arithmetic logic and secondary register control signals such as synchronous clear have been removed. For details on these features, see the Stratix Architecture, Version 3.3, July, 2005, listed above and incorporated by reference herein for all purposes.

Figures 4A, 4B:
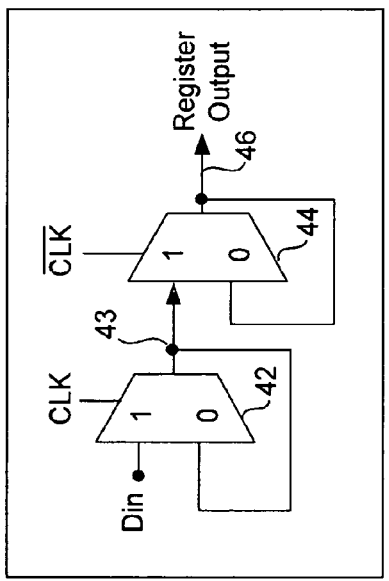
FIG. 4A a block diagram of a register constructed from two cross-coupled muxes and FIG. 4B is a truth table illustrating the operation of the register constructed from the two cross coupled muxes.

Referring to FIG. 4A a block diagram of a register 40 constructed from two cross-coupled muxes 42 and 44 is shown. The first mux 42 is coupled to receive an input signal Din. The output 43 of the first mux 42 is feedback and provided to the second input of the mux 42. The second mux 44 is configured to generate the register output 46 and receive at its inputs the output of mux 42 and the registered output 46. The two muxes 42 and 44 are also configured to receive complementary clock signals CLK and $\overline{CLK}$ respectively. Together, the two muxes 42 and 44 act as a pair of cross coupled latches forming a register.

FIG. 4B illustrates a truth table for the register 40. When CLK is low, the output 43 of the first mux 23 holds its previous value, regardless of the state of input signal Din. As a result, the previous value of Din is latched by mux 44 since $\overline{CLK}$ is high. When CLK transitions high, the mux 42 latches the input signal Din, whereas the register output at mux 44 retains its previous value because $\overline{CLK}$ has transitioned low. In this manner, the two muxes 42, 44 can be configured to implement the register 40.

Figure 5:
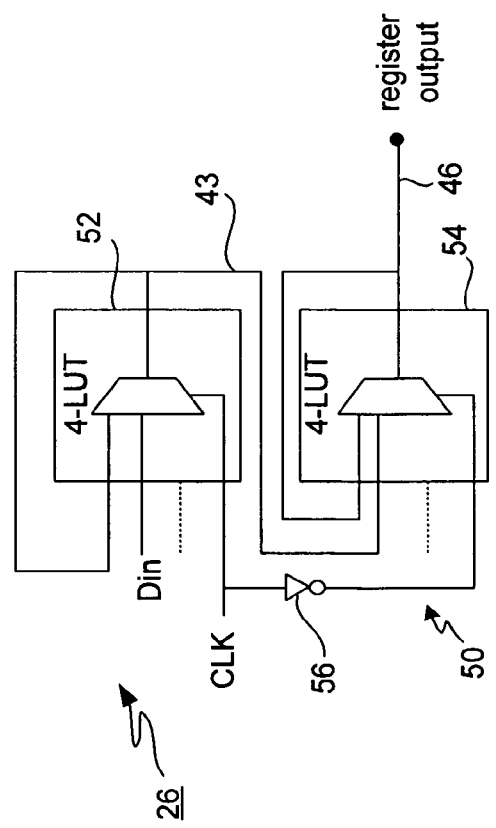
FIG. 5 is a block diagram of two LUTs in a logic element configured as two cross coupled muxes for implementing a register on the exemplary PLD of the present invention.

Referring to FIG. 5, a block diagram of two LUTs in an LE 26 configured as two cross coupled muxes for implementing a register 50 is shown. The register 50 includes a first LUT 52 and a second LUT 54. The first LUT 52 receives at its inputs signal Din, clock signal CLK, and the output 4 of the first LUT 52 feedback to one of the inputs. The second LUT 54 is configured to receive at its inputs the output 43 of the first LUT 52, the register output 46 feedback to the input of the LUT, and $\overline{CLK}$ through inverter 36. Both LUTs 52 and 54 use only three of the four possible inputs. With each LUT 52 and 54, the LUT mask is configured to implement the truth table of FIG. 2B respectively. As a result, the functionality of a register is implemented.

With current PLD designs, there is no existing local interconnect or other hardware resources within the logic elements 26 itself to implement the two feedback paths 43 and 46 or to provide the clock signals CLK and $\overline{CLK}$ to the inputs of LUTs 52 and 54 respectively. As a consequence, the feedback paths must be routed through the general interconnect 24 and/or the interconnect 28 between logic elements 26, as illustrated in FIG. 2. With such an arrangement, the propagation times of the feedback paths are too slow for most circuit applications. It is therefore currently impractical in most applications to implement the LUTs of a logic element 26 to perform a register function.

Figure 6:
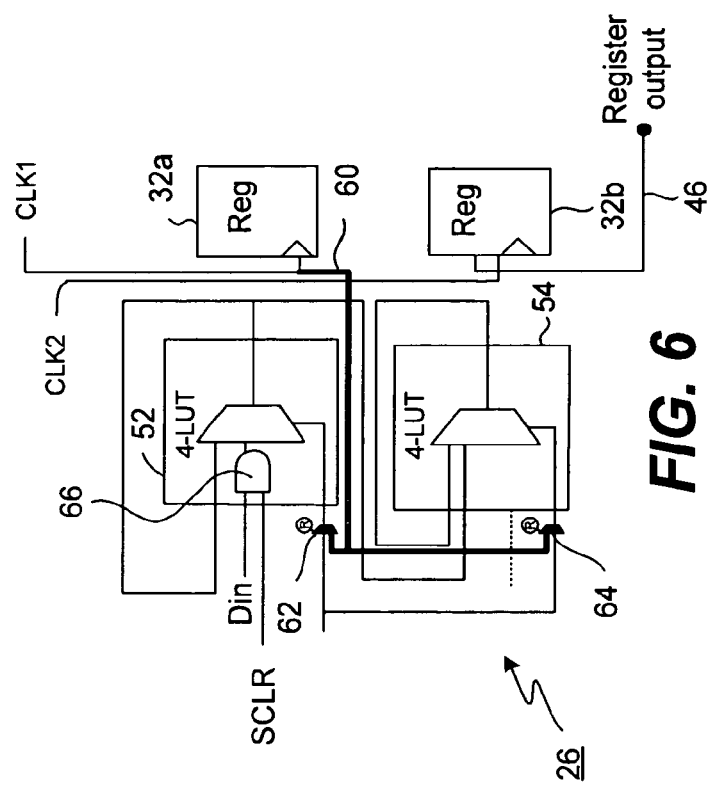
FIG. 6 illustrates a first dedicated hardware implementation to configure the LUTs of the logic element to operate as a register in the exemplary PLD of the present invention.
Figure 8:
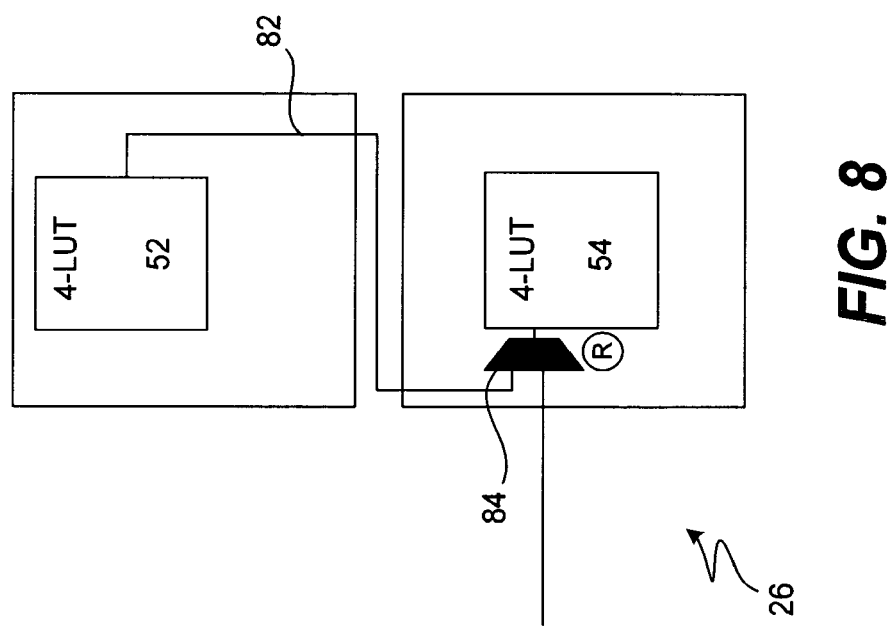
FIG. 8 illustrates a third dedicated hardware implementation to configure the LUTs of the logic element to operate as a register in the exemplary PLD of the present invention.
Figure 10:
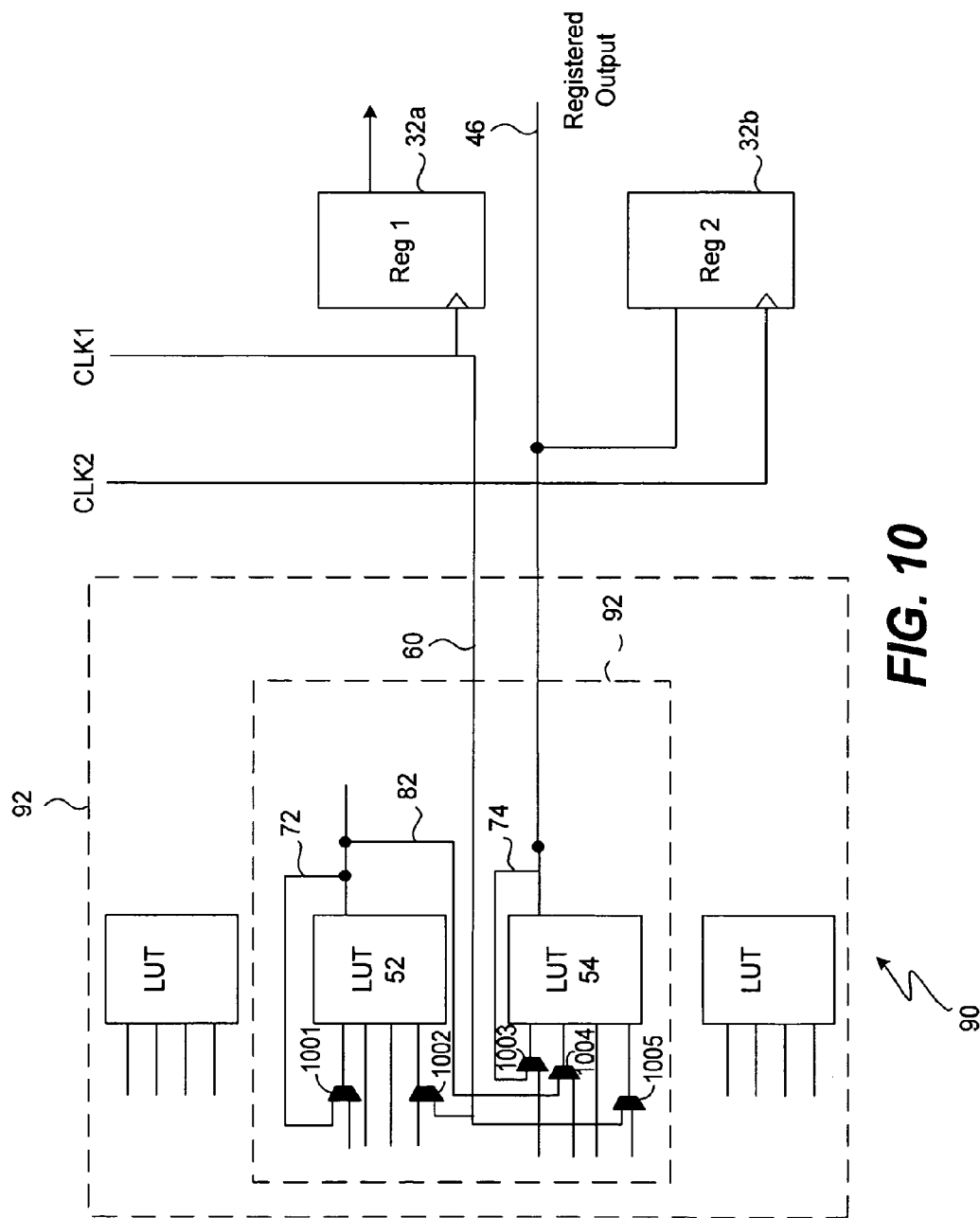
FIG. 10 illustrates a simplified block diagram of an Adaptive Logic Module including the hardware implantations of the present invention.

In FIGS. 6, 7 and 8, first, second, and third dedicated hardware implementations to configure the LUTs of a logic element 26 to operate as a register are illustrated respectively. For the sake of clarity, each hardware implementation is separately shown. It should be understood, however, that in a preferred embodiment, all three dedicated hardware implementations are provided in the logic elements 26, as is illustrated in FIG. 10 for example.

Referring to FIG. 6, the first dedicated hardware implementation to configure the LUTs of a logic element 26 to operate as a register is shown. The first dedicated hardware implementation is a dedicated interconnect 60 (highlighted in bold for the sake of clarity) between the clock CLK1 used to drive the first dedicated register 32a of the LE 26 and the inputs of the two LUTs 52 and 54 respectively. Two select muxes 62 and 64 are provided along the dedicated CLK 1 input and are provided to select between either the dedicated interconnect 60 or a general routing input to the LUTs 52 and 54 respectively. The two select muxes 62 and 64 are controlled by configuration RAM bits R respectively. A second clock signal CLK 2 is provided to drive the second dedicated register 32b of the LE 26. In an alternative embodiment, the dedicated interconnect 60 can be derived from the second clock signal CLK 2. The clock signals CLK1 and CLK 2 are LAB wide interconnects 28 as illustrated in FIG. 2 provided to the LEs 26 within each LAB 14. The output of the second LUT 54 is the registered output signal 46, which is provided as either a combinational output or to the input of register 32b.

In the embodiment shown in FIG. 6, there are additional inputs to LUT 52 that are not used. Given the programmable nature of the LUT 52, these inputs, and changes to the programming of LUT 52, can allow for the insertion of additional logic prior to the input Din of the first latch of the register. For example, FIG. 6 shows an AND gate 66, which together with Din, implements a synchronous clear (SCLR) on the register, meaning that when SCLR is set to a logic zero, the input to the first LUT 52 is forced to logic zero or ground rather than receiving Din. As a consequence, logic zero instead of Din is propagated through the two LUTs 52 and 54 forming the register. In other examples an arbitrary function can be inserted, restricted only by the number of available inputs into the structure.

Referring to FIG. 7, the second dedicated hardware implementation to configure the LUTs of a logic element 26 to operate as a register is shown. The second dedicated hardware implementation are dedicated interconnects 72 and 74 (highlighted in bold for the sake of clarity) between the outputs and inputs of LUTs 52 and 54 respectively. The dedicated interconnects 72 and 74 provide low skew dedicated fast feedback paths which minimize the potential for metastability in regard to register timing and which saves routing resources. In addition, two select muxes 76 and 78 are provided along the dedicated feedback paths 72 and 74 and are used to select either the general inputs or the dedicated feedback interconnects 72 and 74 to LUTs 52 and 54 respectively. The two select muxes 76 and 78 are also controlled by configuration RAM bits R respectively.

Referring to FIG. 8, the third dedicated hardware implementation to configure the LUTs of a logic element 26 to operate as a register is shown. The third dedicated hardware implementation is a dedicated feedback path 82 from the output of LUT 52 to one of the inputs of LUT 54. The dedicated path 82 provides a low skew connection from the output of the first LUT 52 to the input of the second LUT 54. A select mux 84 is provided along the dedicated path 82 and is used to select either a general input or the dedicated feedback path 82 from the first LUT 52. The select mux 82 is controlled by a configuration RAM bit R.

Figure 9A:
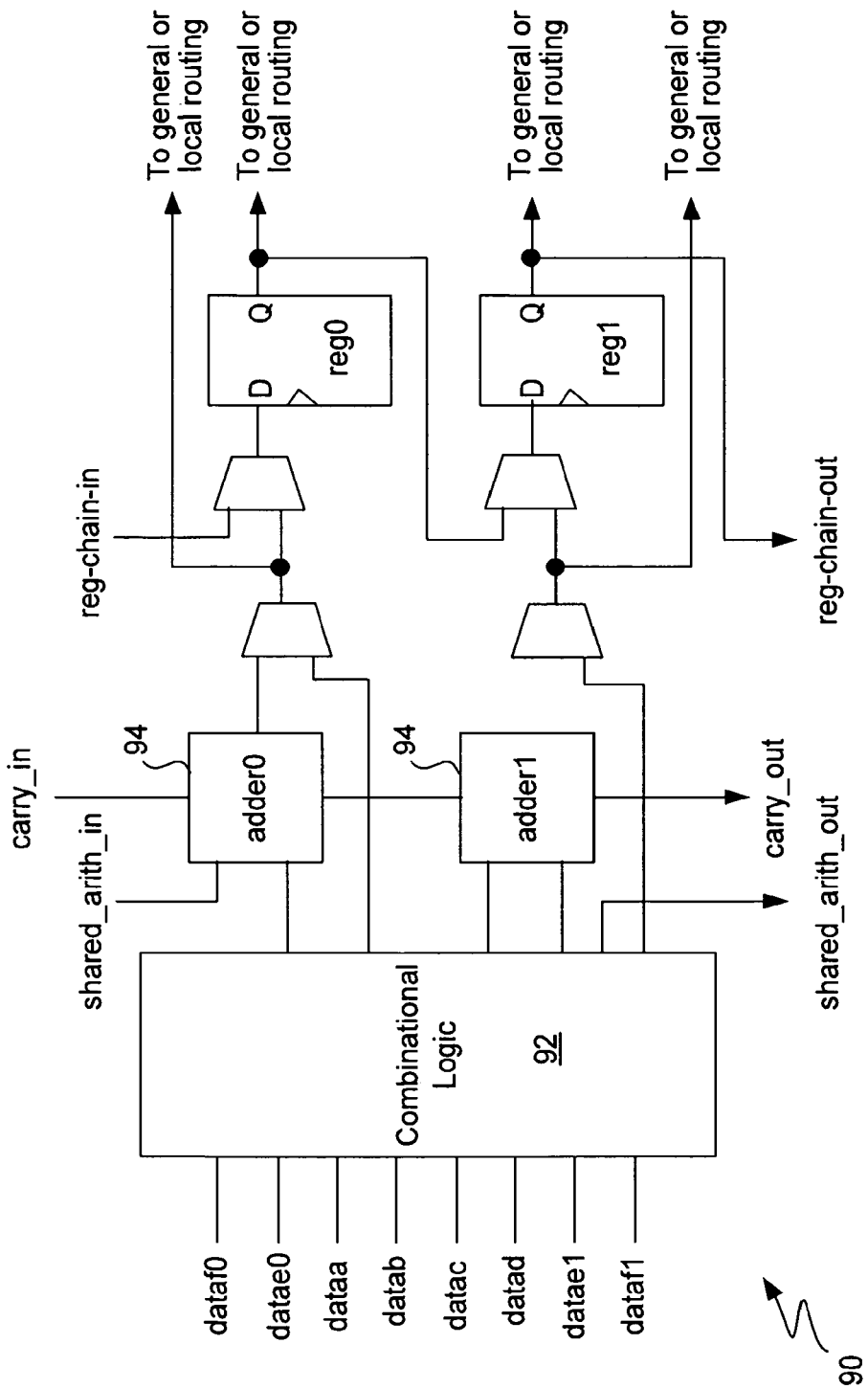
FIGS. 9A and 9B illustrate a high level and a detailed block diagram of an Adaptive Logic Module.
Figure 9B:
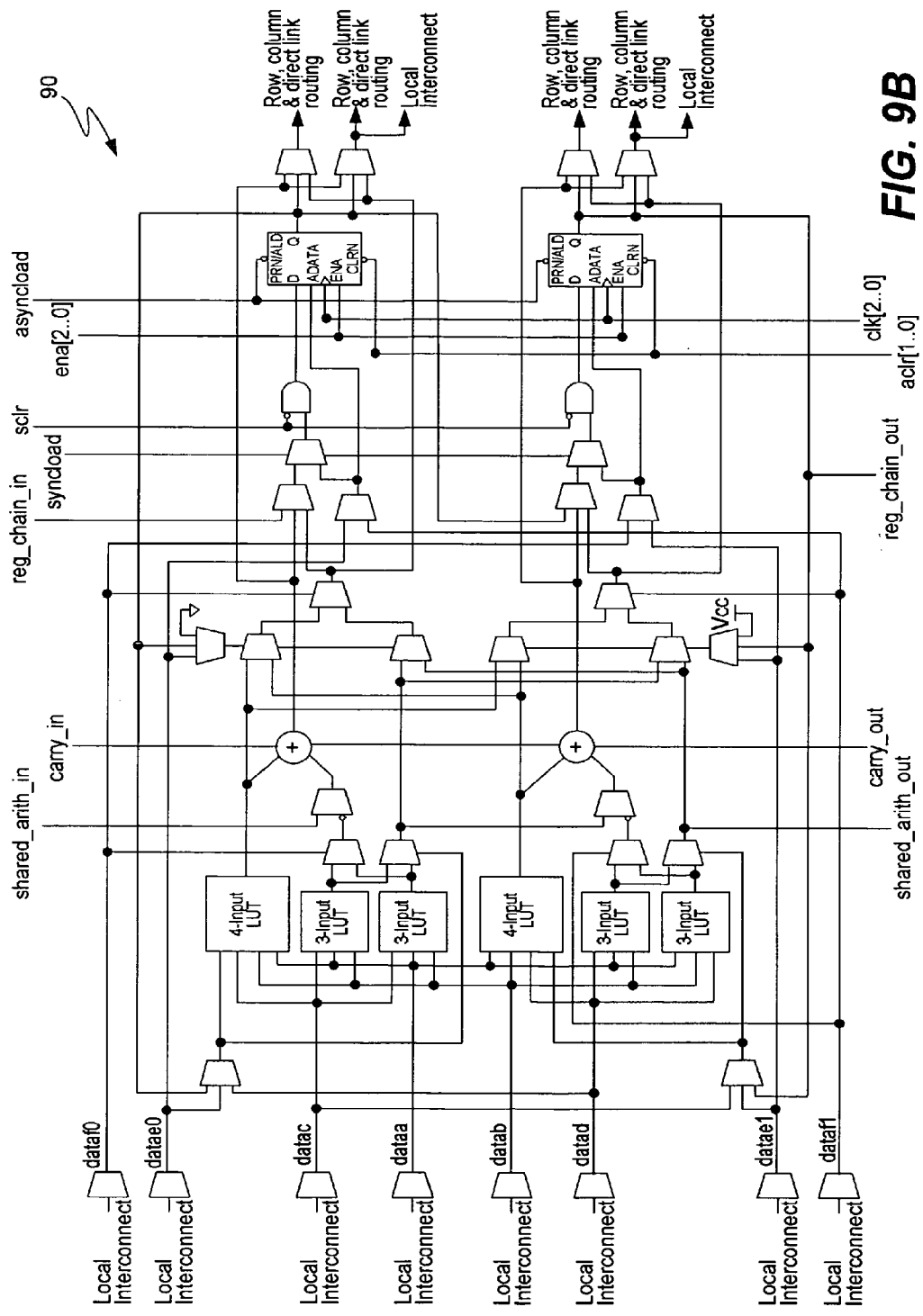

Referring to FIGS. 9A and 9B, a high level and a detailed block diagram of an Adaptive Logic Module (ALM) from an Altera Stratix II device is shown respectively. The ALM 90 is the basic building block of logic in the Stratix II architecture. Each ALM 90 includes adaptive LUT resources contained in the box 92 labeled "combinational logic" in FIG. 9A. The adaptive LUT resources are capable of implementing various combinations of two functions. This adaptability allows the ALM 90 to implement any logic function of up to six inputs and certain seven input functions. In addition, the ALM 90 includes two dedicated adders 94, a carry chain, a shared arithmetic chain, a register chain, and two registers. FIG. 9B shows the detailed logic of the ALM 90. Of relevance to the present invention, the ALM illustrated in FIG. 9B shows the various 4-input and 3-input LUT resources provided in the combinational logic block 92 of FIG. 9A. In one embodiment of the present invention, these LUT resources are used to implement the register function as described in more detail below. For more details of the ALM 90, see the above mentioned Stratix II data book, incorporated by reference herein.

Referring to FIG. 10, a diagram of an ALM 90 simplified to illustrate the present invention is shown. In particular, the ALM 90 as shown illustrates several of the LUT resources provided in the combinational logic bock 92 modified to include the first second and third dedicated hardware implementations as described above. Specifically, the combinational logic block 92 includes the first dedicated hardware implementation (i.e., dedicated interconnect 60) between the clock CLK1 used to drive the first register 32a and the inputs of the two LUTs 52 and 54 respectively. The combinational logic block 92 further includes the second dedicated hardware implementation (i.e., interconnects 72 and 74) provided between the outputs and inputs of LUTs 52 and 54 respectively. The combinational logic block 92 also includes the third dedicated hardware implementation (i.e., dedicated feedback path 82) from the output of LUT 52 to one of the inputs of LUT 54. It should be noted that the block diagram of FIG. 10 is simplified for the sake of illustration and that in an actual embodiment the muxes labeled 1001 and 1004 can be combined into a single mux and the muxes 1002 and 1005 can also be combined into a single mux.

The ALM 90 therefore effectively has three registers that can be used for pipelining or any other register functions. The first two registers include the existing registers of the 32a and 32b. The third register results from configuring the LUTs 52 and 54 as cross-coupled muxes or latches using the first, second and third dedicated hardware implantations. Since the first, second and third dedicated hardware implantations are all local within the ALM 90, the third register can operate at a speed sufficient for most applications, such as pipelining. Accordingly the LUTs of the ALM 90 are not wasted when the dedicated registers 32a and 32b are used for pipelining for example. For the sake of simplicity all the circuit and interconnect details of the ALM 90 have not been shown. For more details, the above mentioned Stratix II literature, incorporated by reference, should be reviewed.

Many commercial 4-LUT based programmable logic devices, for example Stratix® and Cyclone® series devices manufactured by Altera Corp, and Virtex and Spartan series devices manufactured by Xilinx Corp., allow the 4-LUT in the logic elements to be split into a carry part and sum part for implementing arithmetic circuitry. In a further embodiment of the present invention, these two three-LUTs can be used to form the LUT-register hardware.

Figure 11A:
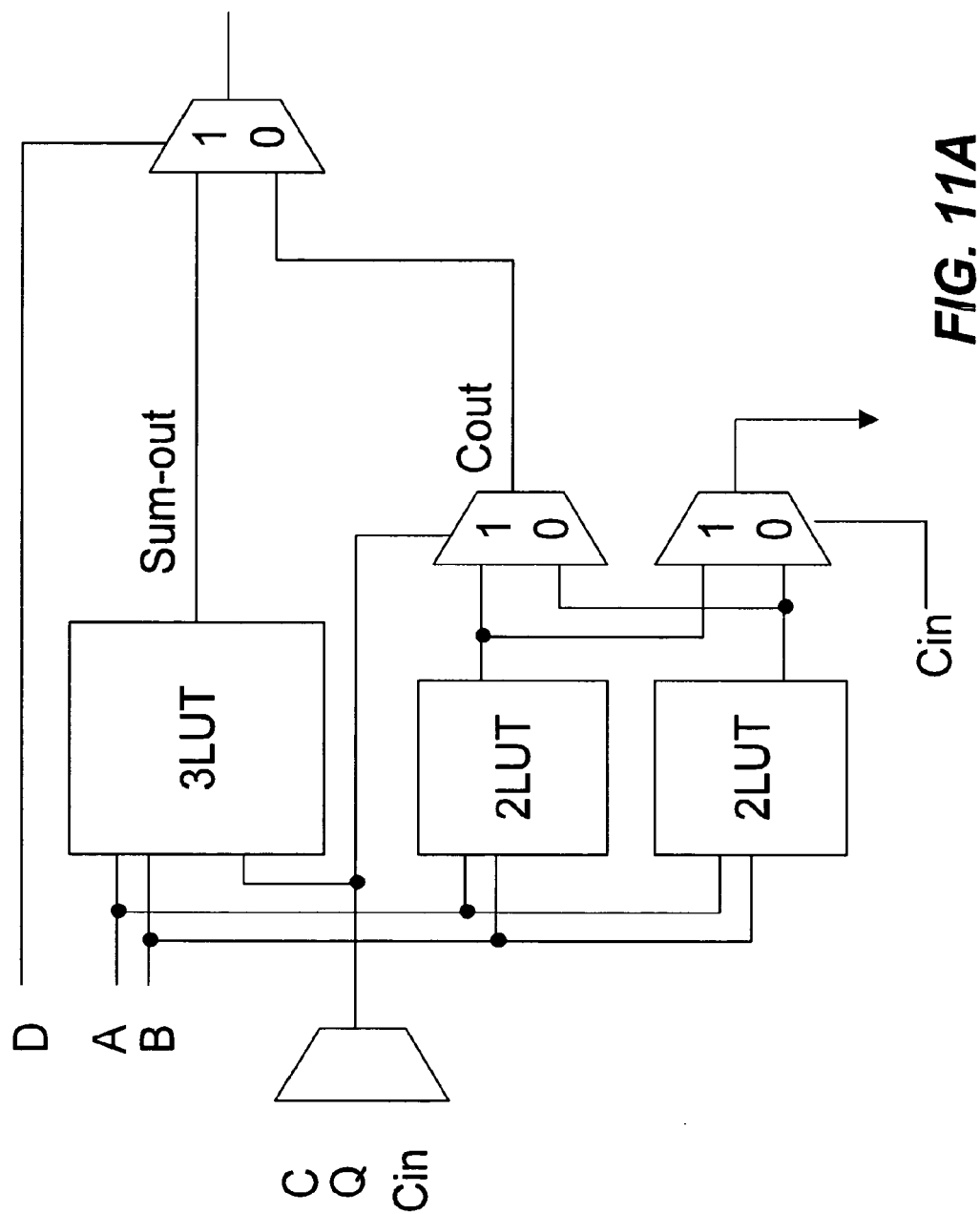
FIGS. 11A, 11B and 11C shows an alternative embodiment which uses the carry-chain hardware present in many 4-LUT based programmable logic devices to implement a LUT-register according to another embodiment of the present invention.

Referring to FIG. 11A, an exemplary 4-LUT 110 and its fracturing into a top-part implementing SUM (labeled "sum-out") and bottom part implementing CARRY (labeled "Cout") is shown.

Figure 11B:
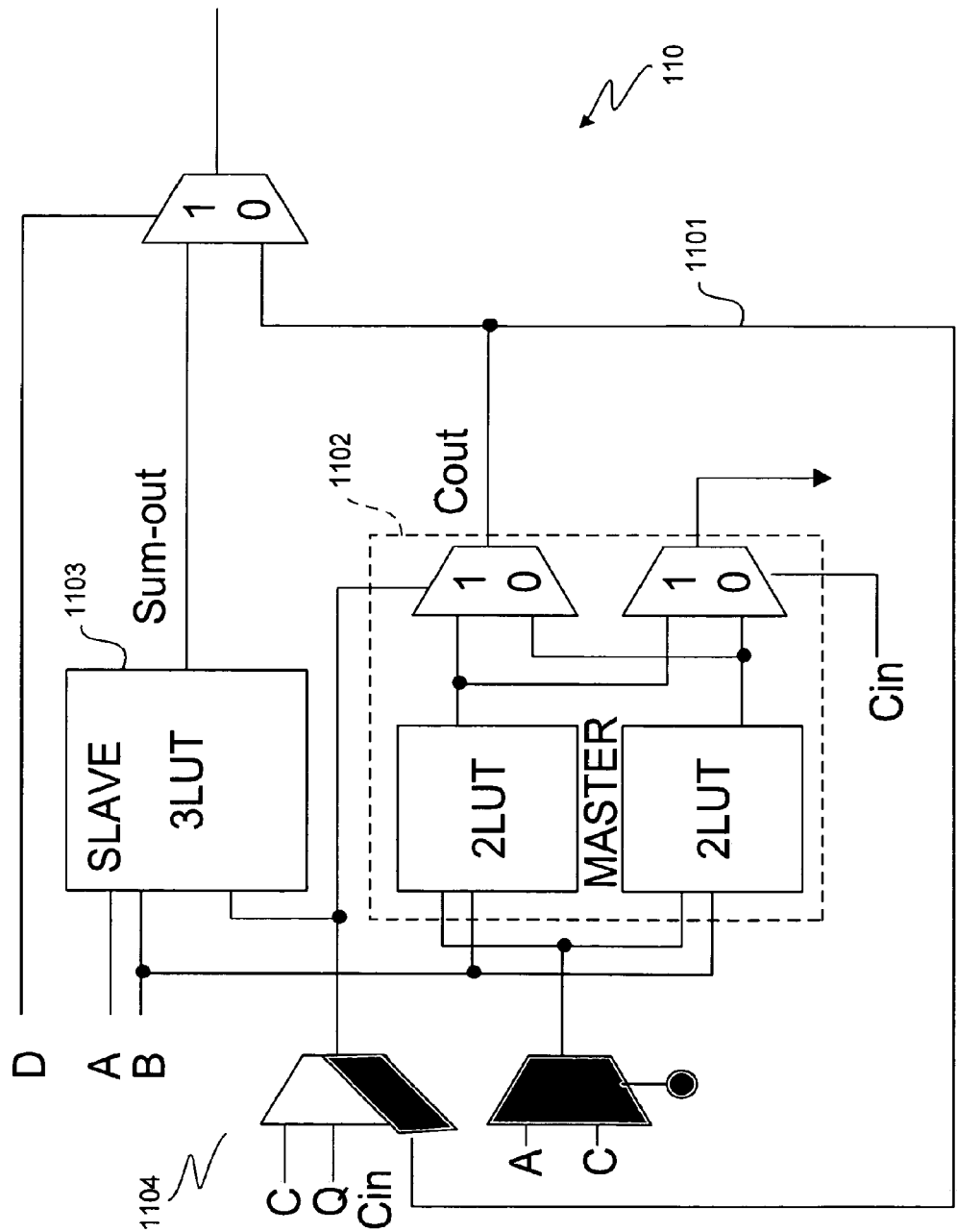

In FIG. 11B, the addition of a feedback path 1101 from the CARRY out to an additional input in the multiplexer 1104 is shown. With this arrangement, the bottom S-LUT is the master latch 1102, the upper 3-LUT the slave latch 1103, the master feedback and feed-forward to the slave is on the C input via the carry output. The LUT-register is completed by routing the slave feedback externally on LUTA and routing the CLK externally on B.

Figure 11C:
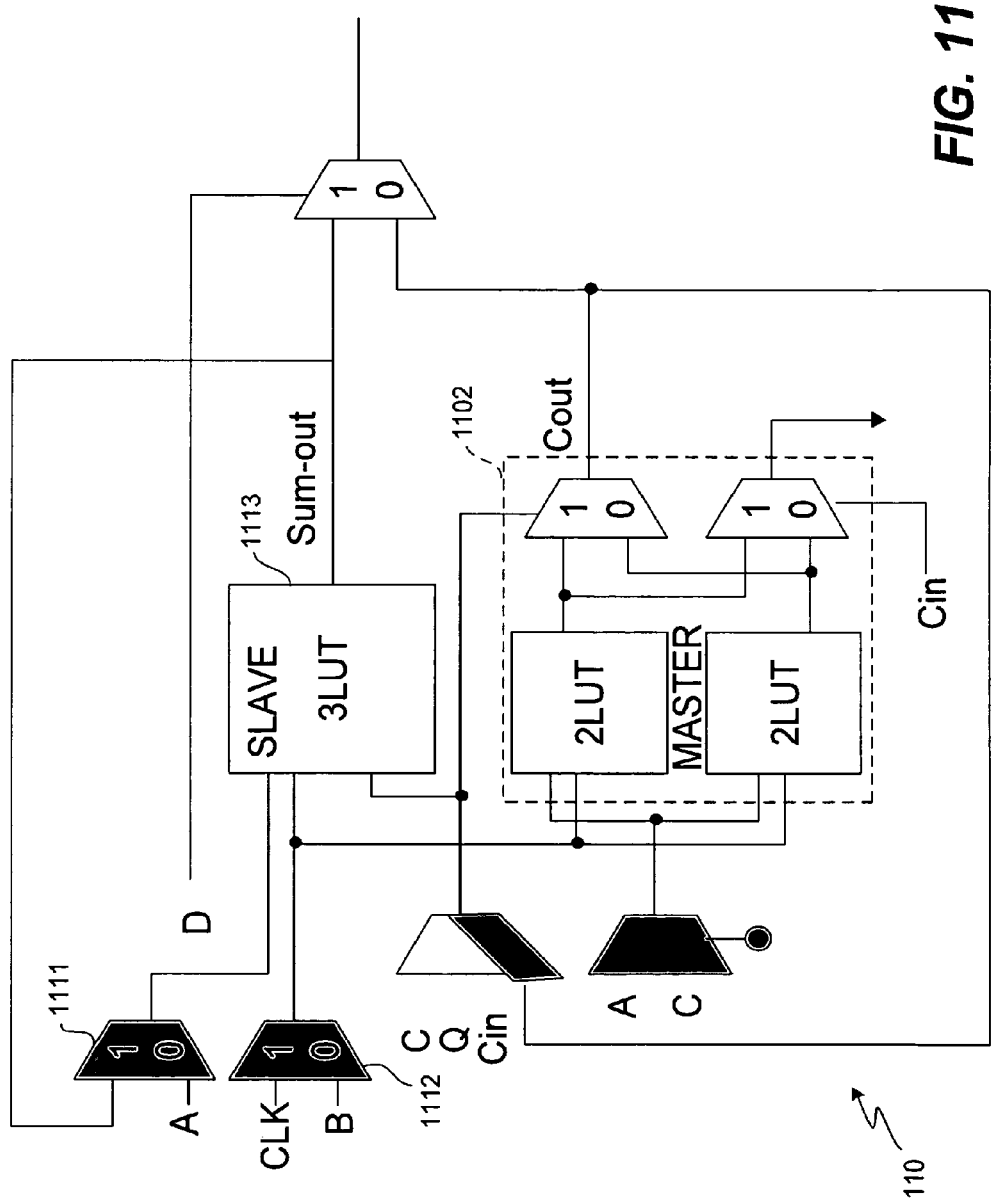

FIG. 11(c) additionally adds the earlier mentioned 2:1 mux 1112 to source the CLK of the associated register of this logic element and external input B to drive internal input B, and a 2:1 mux 1111 sourcing the output of the upper 3-LUT and the external LUTA input and driving the internal LUTA input. Together this would give a "bare" register implemented completely in one 4-LUT-based logic element According to further embodiments of the current invention, the software synthesis program used to program the programmable logic device using the LUTs as registers as described herein is modified to take advantage of the present invention. The generation of a netlist, e.g. from schematic or from an HDL language such as VHDL or Verilog, is modified so as to more effectively take advantage of the hardware modifications to the programmable device. For example, the AND gate 66 of FIG. 6 which effectively generates a DFF-type register with synchronous clear, could be any other gate by appropriate connection of inputs and programming of the LUT.

In one embodiment, the synthesis software will generate a LUT-register with an asynchronous load signal. In further embodiments the synthesis software will generate a LUT-register with a synchronous load signal (requiring both a load signal and a data signal), clock-enable, or combination of signals. Because a LUT is fully programmable in functionality the capabilities of the invention are primarily limited by the number of un-used inputs to the hardware structure and enabled by the aforementioned hardware embodiments of the current invention. These secondary signals are important for effective use of the invention as the "hard" registers found in typical programmable devices contain one or more such signals, as shown in FIG. 9B. Common hard signals include, but are not limited to, synchronous clear, asynchronous clear, preset, synchronous load/data, asynchronous load, asynchronous load/data, and clock-enable.

Referring again to FIG. 9A, a commercial fracturable "ALM" logic element from Altera's Stratix II device is shown. According to the principles of the current invention, use of a LUT-register can be enabled by replacing the internal data A input of the ALM with a new 2:1 mux fed by the clock of REG0 and the external data A input (to realize the clock), replacing the internal data B input to the ALM with a new a 2:1 mux fed by the lower LUT output "LUT1_out" and the external data B input (to achieve the master latch and the feed-forward path), and replacing the internal DC1 input from a new 2:1 mux fed by the upper LUT output "LUT0_out" and the external DC1 input. Using this particular embodiment, secondary signals can be generated for implementation into the ALM-based LUT-register as follows:

In the aforementioned embodiment, which we denote MODE1, the master (first) latch is configured as LUTA=CLK, LUTB=masterlatch, LUTD=DC1 and the slave (second) latch is configured as LUTA=clk, LUTB=masterlatch, and LUTD=slavelatch to make a simple DFF. To achieve the latches we program the master and slave LUT mask with A&B+!A&D which is the function of a 2:1 mux.

In a further exemplary embodiment MODE2 of the present invention we additionally add LUTC=DC0 and program the LUT-masks to allow input DC0 to act as an asynchronous clear (ACLR), namely A&B+!A&D in the master and A&B+!A&D in the slave.

In a further exemplary embodiment MODE3 of the present invention we additionally add to MODE1 the implementation LUTC=DC0 in the master latch and program the LUT-masks to allow input DC0 to act as an synchronous clear (SCLR), namely A&B+!A&!C&D in the master and A&B+!A&D in the slave.

In a further exemplary embodiment MODE4 of the present invention we additionally add to MODE1 the implementation LUTC=DC0 and LUTE=F1 in the master latch and program the LUT-masks to allow input DC0 to act as an synchronous load (SLOAD) with data from LUTE (F1), namely A&B+!A&(E&C&!E) in the master and A&B+!A&D in the slave.

It should be understood that, by appropriate programming of the LUTs and input selection, other alternatives and combinations of these alternatives are possible. The specific connections in the aforementioned MODE1 to MODE4 are exemplary and particular to the specific structure shown in FIG. 10, but the principles would apply to numerous other structures in which the LUT-register invention is applied. For example, several are applicable to the 4-LUT based programmable logic devices Stratix and Cyclone manufactured by Altera Corp. and Virtex or Spartan series devices manufactured by Xilinx Corp. with appropriate LUT-register hardware added as per FIGS. 5 and 6.

In addition to synchronous and asynchronous signals, many arbitrary LUT-based functions can be used prior to the functional register. In the case of the ALM-based LUT-register, the unused inputs to the structure also allow for an arbitrary 3-LUT to be "packed" in front of the register when no secondary signals are used. According to a further embodiment of this invention the synthesis tool will preferentially generate 3-LUT and 2-LUT functions prior to registers to enable reduced logic cell consumption when combined with the current invention. The placement of 3-LUTs or 2-LUTs with LUT-registers can be completed either during the synthesis phase or the placement phase of the implementation of a design into the target architecture. Techniques for re-balancing the sizes of LUTs in technology mapping are described in co-owned and pending patent application Ser. No. 10/745,913, now U.S. Pat. No. 7,110,141, titled "Technology Mapping Technique for Fracturable Logic Elements" by Ratchev et. al, incorporated by reference herein for all purposes.

One of the primary benefits of the dedicated hardware added in the current invention is a reduction in the timing paths inside the cross-coupled latches inside the LUT-register. Nonetheless, the use of some programmable functionality makes the LUT-register have different timing properties than the fully-dedicated REG0 and REG1 as shown in FIG. 10 or other earlier figures. This additional timing can result in both a longer setup delay, which can be accounted for in placement, and also to an increased risk of metastability when the LUT-register is used in series with another register that is clocked by an unrelated or asynchronous clock. According to a further embodiment of the current invention, the methods for placement of the netlist into the cells of the programmable device is modified to restrict functional registers on asynchronous clock-domain crossings from placement into the LUT-register location when a decreased probability of metastability is desired.

Correspondingly, the LUT-register hardware, which in some cases cascades directly into a register with which it shares a clock, is particularly appropriate for implementation of shift-registers, which are registers in series clocked by the same clock. According to the principles of the current invention, shift-register hardware is recognized by the synthesis tool and preferentially implemented using a LUT-register and hard-register in series. When two hard registers in adjacent LEs have register-cascade hardware as illustrated in FIG. 10, shift-registers of depth 3 can be generated by the synthesis tool.

In most commercial and proposed programmable logic devices, the LUT:register ratio is 1:1. With the addition of the LUT-register hardware described in the current invention, this ratio is no longer fixed, because LUTs can be converted to registers. According to a further embodiment of the current invention, synthesis preferences for LUT:register ratios are modified. In particular, algorithms for retiming of register paths (see co-owned pending patent application "Register Retiming Technique" Ser. No. 10/446,650, now U.S. Pat. No. 7,120,883, by van Antwerpen et. al.) can be modified to account for the relative abundance of registers in the device. Similarly, the tradeoff between the use of LE-based registers and embedded memory-based registers for shift-register hardware can be modified to more efficiently implement a user's design in the programmable device.

It should be noted that in all the embodiments shown above, the upper LUT shown feeding the lower LUT to form the register. In an alternative embodiment, however, the complement arrangement can be implemented where the bottom LUT is used to drive the upper LUT. With this arrangement, the dedicated hardware found in many programmable logic devices that allows the output of register $32a$ to cascade to the input of register $32b$ can be combined with this alternative embodiment to allow a series of three registers to be cascaded together in a single ALM without external routing.

Although the present invention was described in the context of a specific type of programmable logic device having LABs, it should be noted that the present invention can be practiced and used in any type of programmable logic device capable having logic blocks using look up tables for implementing logic functions. For example, the present invention can be used in programmable gate array (FPGA), including those having ALMs or Complex Logic Blocks as their basic logic block. For more information on Complex Logic Blocks, see the Virtex Family Overview by Xilinx Corporation, Mar. 26, 2005, incorporated by reference herein for all purposes.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. An electronic device, comprising:
   a general interconnect;
   a plurality of logic array blocks (LAB) interconnected by the general interconnect, at least one LAB including one or more logic elements, each of the logic elements comprising:
   a first look up table configured to generate an output signal;
   a second look up table configured to receive the output signal as an input; and
   dedicated hardware within the logic element to configure the first look up table and the second look up table to operate as a register, without necessity of using the general interconnect.

2. The electronic device of claim 1, wherein the dedicated hardware is further configured to implement the first look up table and the second look up table as cross coupled latches.

3. The electronic device of claim 1, wherein the first look up table is configured as a first latch and the second look up table is configured as a second latch.

4. The electronic device of claim 1, wherein the dedicated hardware comprises a first dedicated interconnect coupled between an output of the first look up table and an input of the first look up table.

5. The electronic device of claim 4, further comprising a selection device provided on the first dedicated interconnect and configured to enable the selection of either the output signal of the first look up table or another signal to provide to the first look up table.

6. The electronic device of claim 4, wherein the dedicated hardware comprises a second dedicated interconnect provided between an output of the second look up table and an input of the second look up table.

7. The electronic device of claim 6, further comprising a second selection mux, provided on the second dedicated interconnect, to enable the selection of either the output of the second look up table or a general input to the second look up table.

8. The electronic device of claim 1, wherein the dedicated hardware comprises a third dedicated interconnect provided between an output of the first look up table and an input of the second look up table.

9. The electronic device of claim 8, further comprising a third selection mux, provided on the third dedicated interconnect, to enable the selection of either the output of the first look up table or a general input to the second look up table.

10. The electronic device of claim 1, further comprising:
a first dedicated register associated with the first look up table, the first dedicated register being configured to receive a clock signal.

11. A method comprising:
generating, by a first look up table within a logic element of a logic array block (LAB), an output signal the LAB being one of a plurality of logic array blocks interconnected by a general interconnect in an electronic device;
receiving, by a second look up table of the logic element, the output signal as input; and,
configuring, with a dedicated hardware within the logic element, the first look up table and the second look up table to operate as a register, without necessity of using the general interconnect.

12. The method of claim 11, wherein the dedicated hardware configures the first look up table and the second look up table as cross coupled latches.

13. The method of claim 11 wherein the dedicated hardware configures the first look up table as a first latch and the second look up table as a second latch.

14. The method of claim 11, wherein a first dedicated interconnect of the dedicated hardware is coupled between an output of the first look up table and an input of the first look up table.

15. The method of claim 14, further comprising selecting, via a selection device provided on the first dedicated interconnect, either the output signal of the first look up table or another signal to provide to the input of the first look up table.

16. The method of claim 14, wherein a second dedicated interconnect of the dedicated hardware is coupled between an output of the first look up table and an input of the first look up table.

17. The method of claim 16, further comprising selecting, via a selection device provided on the second dedicated interconnect, either the output signal of the first look up table or another signal to provide to the input of the first look up table.

18. The method of claim 11, wherein a third dedicated interconnect of the dedicated hardware is coupled between an output of the first look up table and an input of the second look up table.

19. The method of claim 18, further comprising selecting, via a selection device provided on the third dedicated interconnect, either the output signal of the first look up table or another signal to provide to the input of the second look up table.

* * * * *